(12) United States Patent
Schweitzer et al.

(10) Patent No.: US 10,605,887 B2
(45) Date of Patent: Mar. 31, 2020

(54) SYSTEMS AND METHODS FOR REVENUE METER TESTING

(71) Applicant: Schweitzer Engineering Laboratories, Inc., Pullman, WA (US)

(72) Inventors: Edmund A. Schweitzer, Pullman, WA (US); Jean M. Leon Eternod, Mexico City (MX); David E. Whitehead, Pullman, WA (US); Julian M. Alzate, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 226 days.

(21) Appl. No.: 15/491,837

(22) Filed: Apr. 19, 2017

(65) Prior Publication Data

US 2017/0322283 A1 Nov. 9, 2017

Related U.S. Application Data

(60) Provisional application No. 62/331,843, filed on May 4, 2016.

(51) Int. Cl.
*G01R 35/04* (2006.01)
*G01D 18/00* (2006.01)
*G01D 4/00* (2006.01)

(52) U.S. Cl.
CPC ............. *G01R 35/04* (2013.01); *G01D 4/004* (2013.01); *G01D 18/00* (2013.01); *Y02B 90/242* (2013.01); *Y04S 20/322* (2013.01)

(58) Field of Classification Search
CPC ...................................................... G01R 35/04
See application file for complete search history.

(56) References Cited

U.S. PATENT DOCUMENTS 6,133,720 A * 10/2000 Elmore ................... G01R 35/04
324/142
6,735,535 B1 * 5/2004 Kagan .................. G01R 21/133
324/142
2016/0259026 A1 * 9/2016 Leidy ..................... G01R 35/04

* cited by examiner

*Primary Examiner* — Patrick Assouad
*Assistant Examiner* — Feba Pothen
(74) *Attorney, Agent, or Firm* — Justin K. Flanagan; Bradley W. Schield

(57) ABSTRACT

Continuous monitoring of an electric power system during testing of a primary electric power meter is described herein. Electric power system signals or test signals may be selectively supplied to the primary electric power meter. Electric power system signals may be supplied to a secondary meter while a test signal is applied to the primary electric power meter. The secondary meter may record and/or transmit monitoring functions and communicate the results of the monitoring functions to the primary electric power meter while the test signals are supplied to the primary electric power meter.

23 Claims, 12 Drawing Sheets

SYSTEMS AND METHODS FOR REVENUE METER TESTING

RELATED APPLICATIONS

This application claims priority under 35 U.S.C. § 119 to U.S. Provisional Patent Application No. 62/331,843 filed on May 4, 2016, titled "Revenue Meter Testing System," which application is hereby incorporated by reference in its entirety.

TECHNICAL FIELD

This disclosure relates to testing of electric power meters. More particularly, this disclosure relates to testing of electric power meters and other monitoring, measuring, and/or reporting devices without loss of data monitoring during testing.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1A:
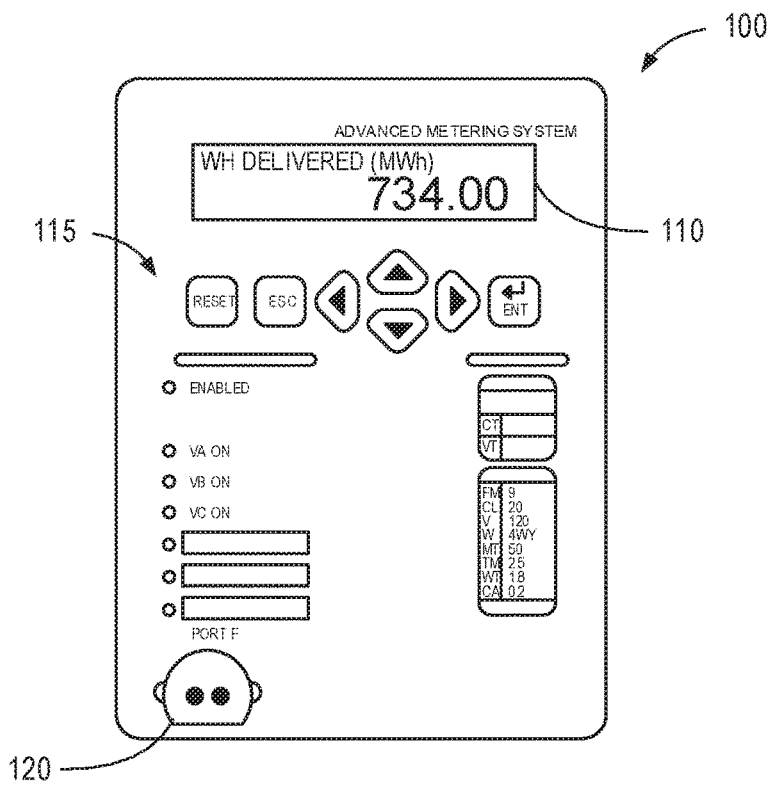
FIG. 1A illustrates a power consumption meter for measuring electrical power consumption, according to one embodiment.

Electric power may be monitored using an electric power meter. Electric power meters may be used to monitor various aspects of electric power such as, for example, energy, demand, power, current, voltage, frequency, load, waveform, flicker, voltage sag/swell/interruptions (VSSI), sequence of events, harmonics, and the like. Such data may be useful for revenue calculations, power quality analysis, protection settings, protective actions, system control, and/or historical data research. To ensure that a meter is functioning properly, it may be subject to testing at commissioning and at various times during use. For example, intertie tariffs may mandate testing on a periodic schedule. For example, some categories of meters may be tested on an annual basis and other categories of meters may be tested more frequently, such as monthly, weekly, or even daily.

In some embodiments, testing a meter may require removing the meter from service for testing. For example, a meter may be physically removed from the electric power system for testing. In other embodiments, the meter may be switched to allow for meter inputs to selectively receive power from either the electric power system or from a testing input. Whether physically removed or electrically removed via a switch, the removal of the meter from service results in a time period of unmonitored electric power. Disclosed herein are systems and methods for testing, replacing, and/or confirming the functionality of an electric power meter without loss of measurement data, protective functionality, control functionality, and/or monitoring functionality.

According to one embodiment, a primary meter may be initially used to monitor an electric power system. To test the primary meter, a secondary meter may be connected to a test switch. The test switch may be used to selectively disconnect (physically, electrically, and/or operationally) the primary meter from the electric power system and connect the secondary meter to the electric power system.

In some embodiments, the primary meter may simply ignore electrical signals from the electric power system during testing operations. The electrical signals that are normally monitored by the primary meter may be monitored by the secondary meter during testing operations. For example, in some embodiments, the secondary meter may be capture data from the electrical signals from the electric power system via solid core transducers, split core transducers, and/or Rogowski coils.

In some embodiments, communication may be established between the primary and secondary meters for real-time data transfer or after testing for a post-testing data transfer. In some embodiments, the primary and secondary meters may be time-aligned to ensure that transferred data is accurate to a desired or necessary resolution. The secondary meter may be used to monitor the electric power system while the primary meter is being tested.

To test the primary meter, test signals (such as from a reference power generator) may be applied to the primary meter. Known values may be transmitted from a testing device to the primary meter. If the values measured by the primary meter match the known testing values (or are within a reasonable tolerance), then the primary meter can be confirmed as functional or otherwise validated as operational. If the values measured by the primary meter deviate from the known testing values by more than an acceptable amount, the primary meter may be identified as having failed.

In some embodiments, measured values captured by the secondary meter are transferred in real-time to the primary meter. Thus, if other systems (such as SCADA monitoring or protection systems) are receiving or requesting data from the primary meter during testing, the primary meter may still provide accurate system data as captured by the secondary meter during testing (as opposed to measured testing data). Upon conclusion of the testing, the test set may be disconnected, and the electric power system signals may be re-applied to the primary meter such that the primary meter may continue to perform monitoring functions using the electric power system signals and recording results thereof in its memory or another data store.

In other embodiments, the measured values captured by the secondary meter are transferred post-testing or periodically during testing rather than in real-time. The primary meter and the secondary meter may be time-aligned and/or utilize the same time signal such that measured data is time-aligned to a desired resolution. Whether data is transferred in real-time or post-testing, the record of monitored system data stored within the primary meter or other connected system may be continuous and/or uninterrupted, even during the period(s) when the primary meter was disconnected from the electric power system for replacement or testing.

Many of the embodiments described herein are described in terms of two test switches, with one test switch selectively providing electric power system signals or test set signals to the primary meter and a second test switch selectively providing electric power system signals to a secondary meter, other implementations are possible using fewer test switches. For example, a single switch may redirect power from the electric power system to a secondary meter and connect the primary meter to a test signal. Alternatively, connection of the primary meter to a test signal generation may be manual.

In one embodiment, a secondary meter may be connected to the electric power system to measure the same system as the primary meter for concurrent measurement. The secondary meter may be used as a reference meter to confirm that that the primary meter measurements match those of the secondary, reference meter.

In other embodiments, alternative hardware may be used to selectively provide signals to the primary and secondary meters. Any hardware capable of selectively providing electric power system signals to the primary and secondary meters, and switching the signals to the primary electric meter from electric power system signals to test set signals, may be used in accordance with the several embodiments herein. For example, transistors may be used to control the signals from the electric power system and/or test set to the primary and secondary meters. Such transistors may be controlled using a microcontroller, physical switch, integrated circuits, or the like.

Furthermore, while there are specific advantages to using a portable secondary meter and/or portable test set, there may be alternative advantages to using permanently installed secondary meters and/or permanently installed test sets. According to several embodiments herein, the secondary meter and/or test set may be permanently installed along with the primary meter. For example, in one embodiment, a particular panel may include one or more primary meters (when multiple primary meters are used, each may monitor a separate portion of an electric power delivery system), along with one or more test sets and one or more secondary meters. The primary meters, secondary meter(s) and/or test set(s) may be permanently installed and in electrical communication with hardware capable of selectively providing the same electric power system signals to a primary meter under test and the secondary meter, and selectively switching the signals to the primary meter from electric power system signals to test set signals. Thus, when the primary meter under test is receiving the test set signals, the secondary meter is used to monitor the portion of the electric power delivery system that is typically monitored by the primary meter under test. As described in the several embodiments herein, the secondary meter may immediately in real-time, or at a later time, communicate the results of the monitoring functions to the primary meter under test that were performed during testing of the primary meter.

According to one embodiment, the electric system signals may be simultaneously available to both the primary and secondary meters. During a predetermined time period, both the primary and secondary meters may apply monitoring functions to the same electric power system signals. One of the primary and secondary meters may communicate the results of its monitoring functions to the other meter for comparison and evaluation. Thus, a primary and/or secondary meter may be verified using the other meter.

In addition to using a secondary meter to facilitate testing of a primary meter without loss of data during the testing thereof, the secondary meter may be used to continue monitoring the electric power system in the event that the primary meter fails the testing thereof. Accordingly, the secondary meter may be configured to not only communicate the results of its monitoring functions to the primary meter, but also to record the results of its monitoring functions during the test. In the event that the primary meter fails the test, or for any other reason it is determined that the primary meter will not be used, the secondary meter may continue to monitor the electric power system in place of the primary meter.

In one embodiment, the primary meter may be configured to upload certain of its data to the secondary meter. For example, the primary meter may be configured to accept a command such as a decommissioning command whereby when such command is executed, the primary meter uploads certain results of its monitoring functions to the secondary meter. For example, the primary meter may be configured to upload monitoring functions for a particular time period, cumulative sums, or the like to the secondary meter. The secondary meter may continue to perform monitoring functions and recording results thereof until the primary meter (or a replacement for the primary meter) is installed, at which time such results may be transmitted to the primary meter.

Thus, an installed monitoring system may include a first test switch that is in electrical communication with an electric power system to selectively switch electrical signals to a primary meter during non-test operations and to a secondary meter during test operations. The primary and secondary meters may the same types of meters and/or differ in functionality. During test operations, the secondary meter may capture energy data (e.g., consumption data and/or power quality data) while a test signal injector injects a known test signal to the primary meter. A validation module, which can be implemented as a hardware or software component, may evaluate the energy data captured by the primary meter during testing. If it matches the known test signal, functional status of the primary meter may be validated, otherwise a failure status or alarm may be made.

As previously described, a time alignment module may align the primary and secondary meters, or a common time signal may be used to ensure time-aligned data captures. Data captured by the secondary meter during testing may be directly communicated (in real-time or post-testing) to the primary meter or stored in a data store accessible to the primary meter. Thus, energy data captured by the primary meter during pre-testing and post-testing time periods may be combined with energy data captured by the secondary meter during the testing time period.

The systems and methods described herein may be utilized in conjunction with newly designed meters as well as existing meters and metering systems. By way of example and not limitation, the systems and methods described herein are applicable to power quality and revenue meters as well as stand-alone revenue meters. Moreover, meters, control systems including meters, monitoring systems including meters, protective systems including meters, and other systems incorporating systems may be embodied as an intelligent electronic device (IED) and/or include an IED. In various embodiments, the systems and methods for testing and/or confirming the functionality of an electric power meter may be embodied as one or more IEDs the include one or more meters and/or are operably connected to one or more meters.

The general description above, and the specific embodiments discussed below, focus primarily on metering devices. However, it is appreciated that the systems and methods described herein are applicable with little or no modification to any of a wide variety of monitoring devices, measurement devices, reporting devices, relaying devices, and the like. For example, a monitoring device, (such as a monitoring IED) connected to one or more phase lines may be configured to measure voltages, currents, and/or calculate synchrophasors. During testing of the IED, the IED may normally be non-operational.

Using the systems and methods described herein, the inputs to the IED may be temporarily switched, routed, or otherwise directed to a secondary IED that can be used to perform the "primary" IED's functions while the primary IED is being tested. More significantly that simply a backup IED, the secondary IED may communicate with the primary IED while the primary IED is in a test mode. In the test mode, the primary IED may continue to communicate with other networked devices as if it were still fully functional (e.g., provide monitored data results, calculations, when in reality the primary IED may be using the data and calculations received from the secondary IED in real time. Moreover, the secondary IED may communicate all the measured data and calculations to the primary IED to complete the primary IED's data collection history, including even the data gap when it was being tested. This may be especially significant when the primary IED uses historical data to make real-time decisions.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1A illustrates a power consumption meter 100 for measuring electrical power consumption, according to one embodiment. As illustrated, the power consumption meter 100 may include a display 110, control inputs 115, and a data input port 120. According to various embodiments, the power consumption meter 100 may provide high accuracy at unity power factor with bidirectional, full four-quadrant energy metering for generation, interchange, transmission, distribution, or industrial applications. Captured data may be provide a load profile for short or long periods of time, even years if desired. The power consumption meter 100 may include synchronized phasor measurements and/or line-loss compensation.

Figure 1B:
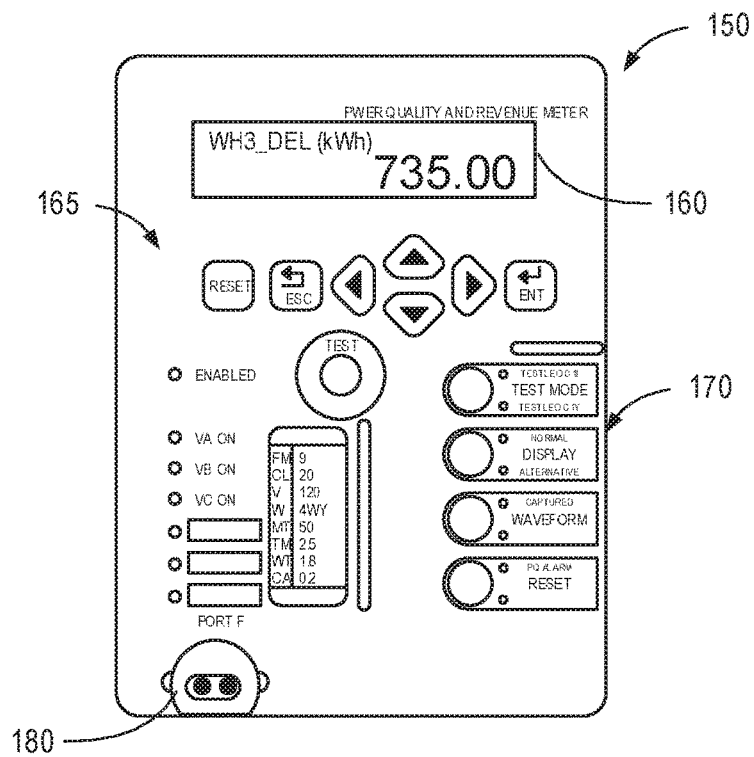
FIG. 1B illustrates a combined power quality and consumption meter, according to one embodiment.

FIG. 1B illustrates a combined power quality and consumption meter 150, according to one embodiment. Again, the power quality and consumption meter 150 may include a display 160, control inputs 165 and 170, and data input ports 180. In various embodiments, the power quality and consumption meter 150 may be portable and provide metering, such as for revenue calculations, and power quality monitoring of an electrical system. The power quality and consumption meter 150 may provide ITIC and/or CBEMA curves to report reliability metrics, identify imbalance and/or overvoltage reports, log damaging voltage deviations.

Furthermore, the power quality and consumption meter 150 may provide high-resolution waveform capture and provide time stamps for aligning power quality issues with equipment operation. The power quality and consumption meter 150 may provide harmonic recording and alarms for specific harmonic disturbances. The power quality and consumption meter 150 may also provide and revenue-accurate billing quantities that include energy, demand, and/or time-of-use metering.

Figure 2:
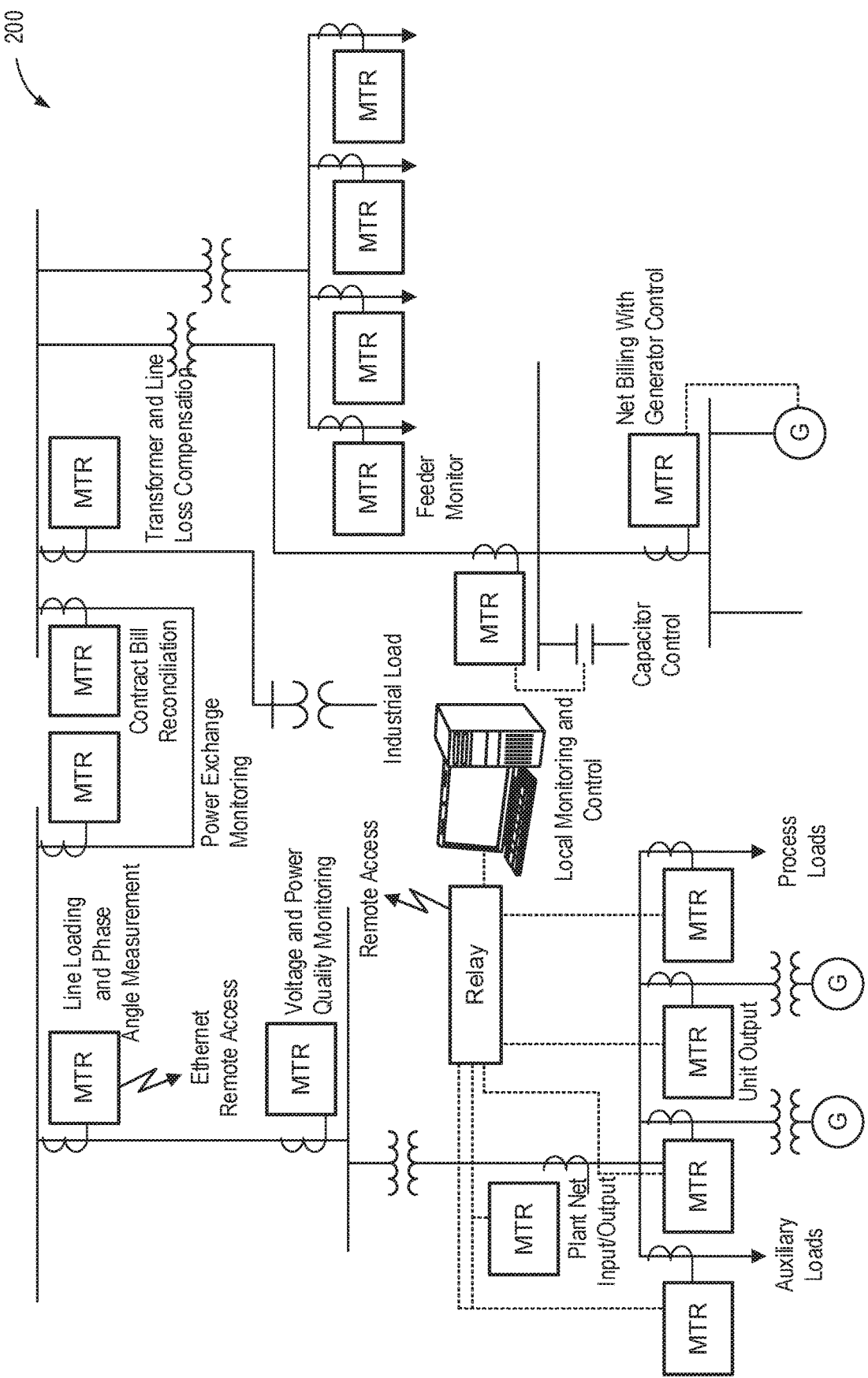
FIG. 2 illustrates a simplified model of an electrical power distribution system with a plurality of power quality and/or consumption meters, according to one embodiment.

FIG. 2 illustrates a simplified model of an electrical power distribution system 200 with a plurality of power quality and/or consumption meters labeled as MTR, according to one embodiment. As illustrated, each MTR may be a power quality and/or consumption meter, such as those shown in FIGS. 1A and 1B. Thus, power quality and/or consumption meters may be used for line loading and phase angle measurement, contract bill reconciliation, transformer and line loss compensation, feeder monitoring, power quality monitoring, capacitor control, net billing with generator control, net input/output, and/or load consumption. FIG. 2 merely provides some example applications and uses for power quality and consumption meters. Alternative uses and/or applications exist and may be used in combination with the data-lossless testing systems and methods described herein.

Figure 3:
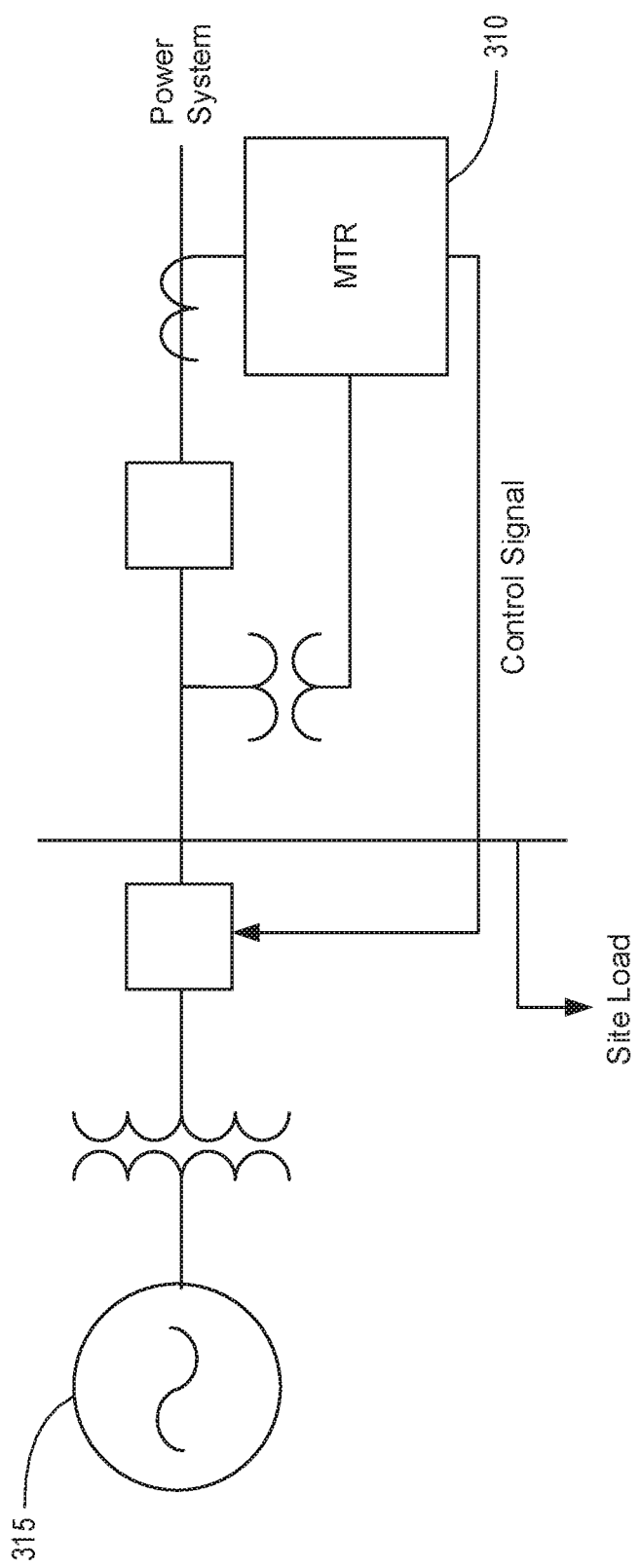
FIG. 3 illustrates a power consumption and/or power quality meter for controlling distributed power generation, according to one embodiment.

FIG. 3 illustrates one such alternative use. Specifically, FIG. 3 illustrates a power consumption and/or power quality meter 310 for controlling distributed power generation by generator 315, according to one embodiment. The power consumption and/or power quality meter 310 may be used to provide automatic start and/or remote control of distributed generation facilities. In such an installation, it may be important that a backup or secondary meter provide replacement functionality while the meter 310 is being tested.

Figure 4:
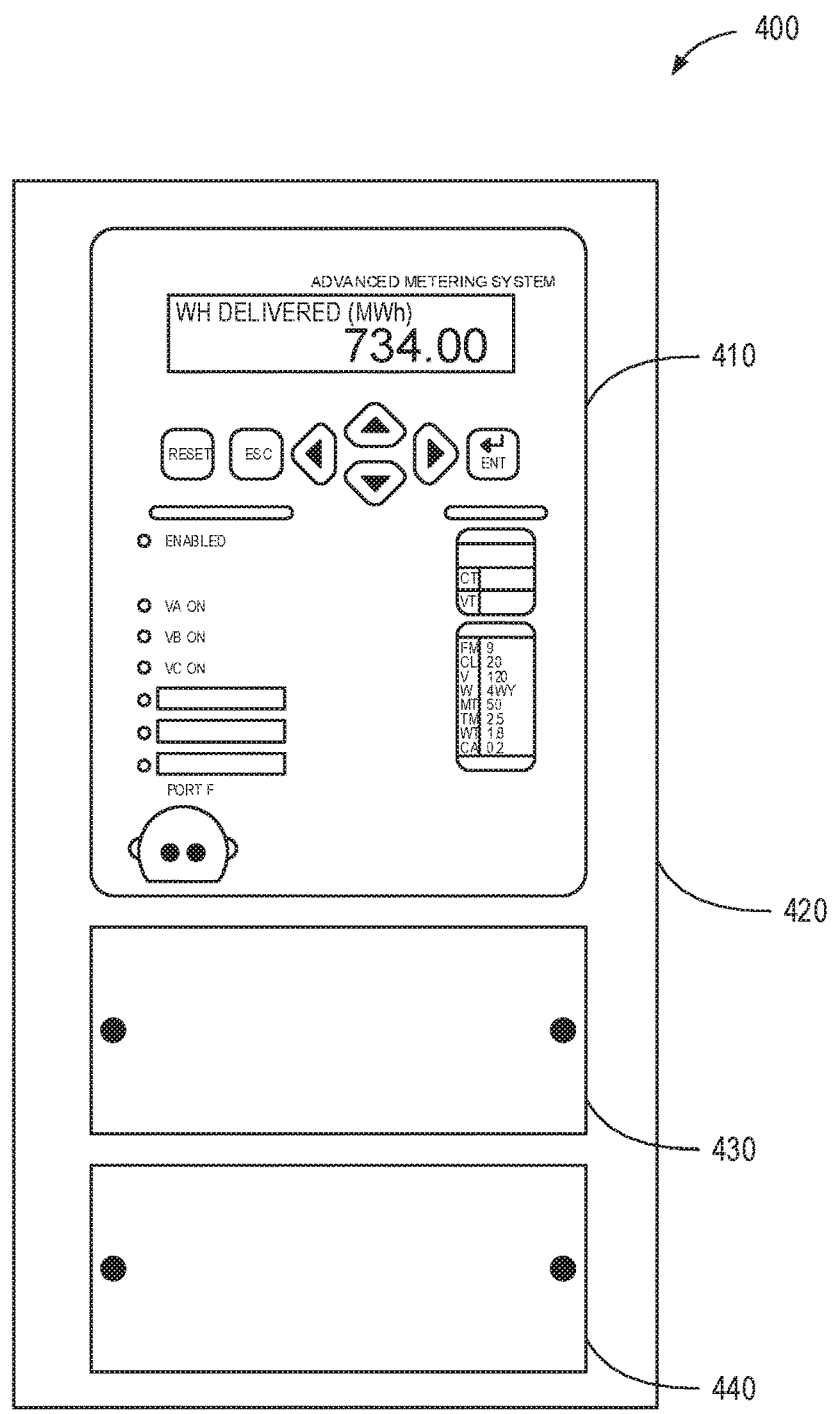
FIG. 4 illustrates a power consumption and/or power quality meter with quick access ports for injecting test source energy to the meter and diverting system energy to a backup meter, according to one embodiment.

FIG. 4 illustrates a power consumption and/or power quality meter system 400 that includes a primary meter 410 installed on a panel 420 to monitor an electric power system. The panel 420 may also include a test access port 430 to connect the primary meter 410 to a test signal. For example, a reference test signal may be injected into the primary meter 410 by a reference signal generator via the test access port 430. The panel 420 may also include a system test port 440 may allow the electric power system to be connected to a secondary or backup meter.

The primary meter 410 may perform any combination of the functions described herein related to power quality, consumption, and/or revenue monitoring. A secondary and/or backup meter connected to the electric power system via the system test port 440 may perform the same and/or additional functions while the primary meter 410 is tested and/or replaced, as described herein.

Figure 5:
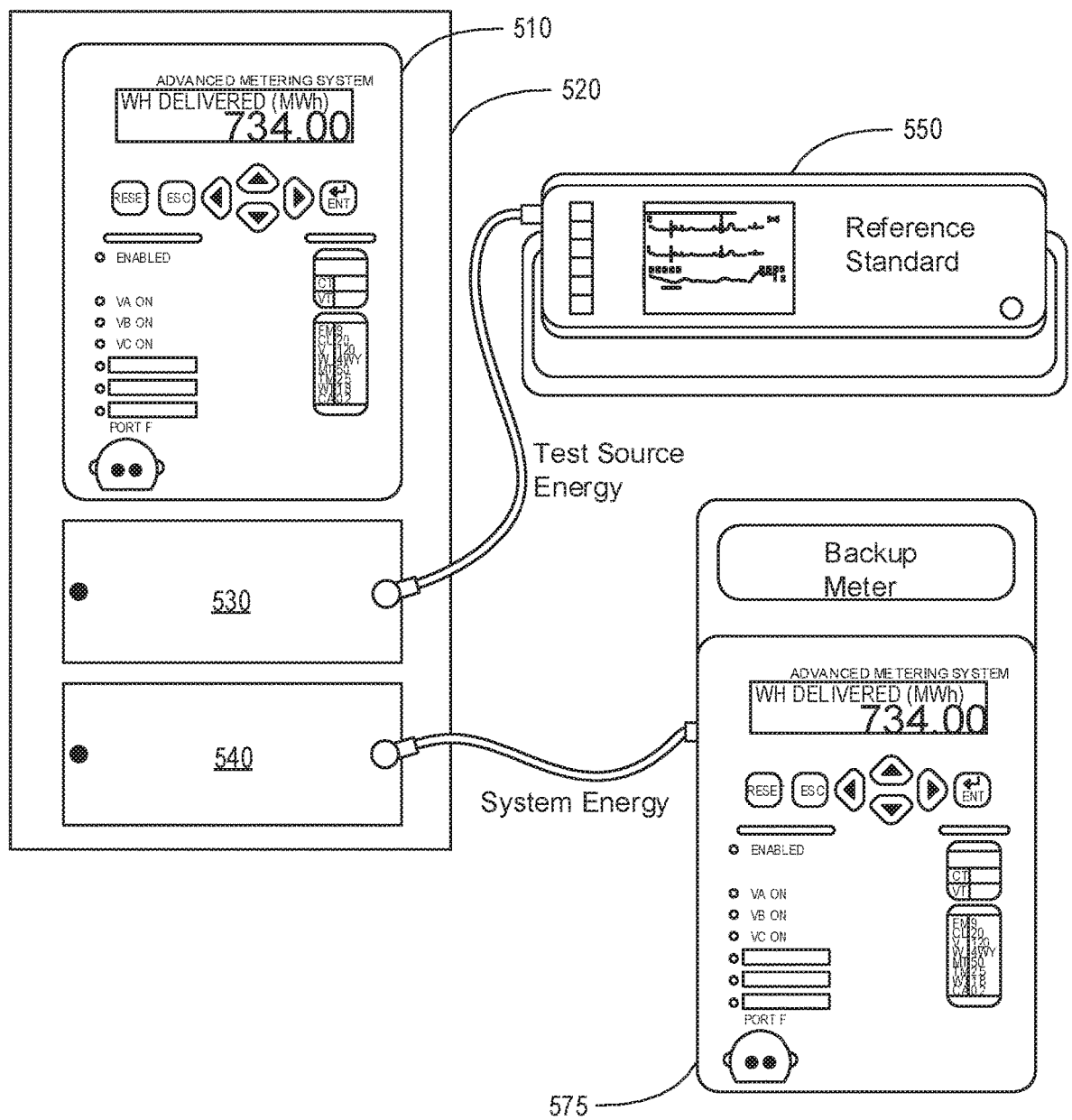
FIG. 5 illustrates a primary meter being tested while a backup meter continues to monitor power consumption and/or quality, according to one embodiment.

FIG. 5 illustrates a primary meter 510 mounted to a panel 520 that includes a test access port 530 and a system access port 540. The primary meter 510 may monitor an electric power system and collect and transmit power quality and/or consumption data to other systems within the electric power system. As illustrated, a reference standard test signal injection device 550 may inject a test signal via the test access port 530 into the primary meter 510. The signal injection device 550 may inject a known signal into the primary meter 510. If the data collected by the primary meter 510 matches the known signal or is at least within a predetermined tolerance, the primary meter 510 may be validated or otherwise confirmed as functional. Otherwise, the primary meter 510 may fail testing.

While the primary meter 510 is being tested, a secondary or backup meter 575 may be connected to the electric power system via the system access port 540. While the primary meter 510 is being tested, the secondary meter 575 may collect the power quality and/or consumption data. In some embodiments, the secondary meter may be connected to the other system within the electric power system to directly provide the collected data.

In another embodiment, the secondary meter 575 may be connected to the primary meter 510 for real-time data transfer. The primary meter 510 may be placed in a testing mode during test operations. While in the testing mode, the primary meter 510 may store and/or transmit data collected by the secondary meter 575 as the system data, differentiated from the data collected based on the test signal injected by the test signal injection device 550. In yet another embodiment, the secondary meter 575 may be connected to the primary meter 510 for post-testing data transfer. The primary meter 510 may be placed in a testing mode while it is being tested (i.e., during test operations). While in the testing mode, the primary meter 510 may wait to record and/or transmit data collected by the secondary meter 575 as the system data once it is transferred from the secondary meter 575.

In one or more of the embodiments described herein, the secondary meter 575 may be time synchronized with the primary meter 510 to ensure that data collected during testing is time-aligned with data previously and subsequently collected by the primary meter 510.

Figure 6:
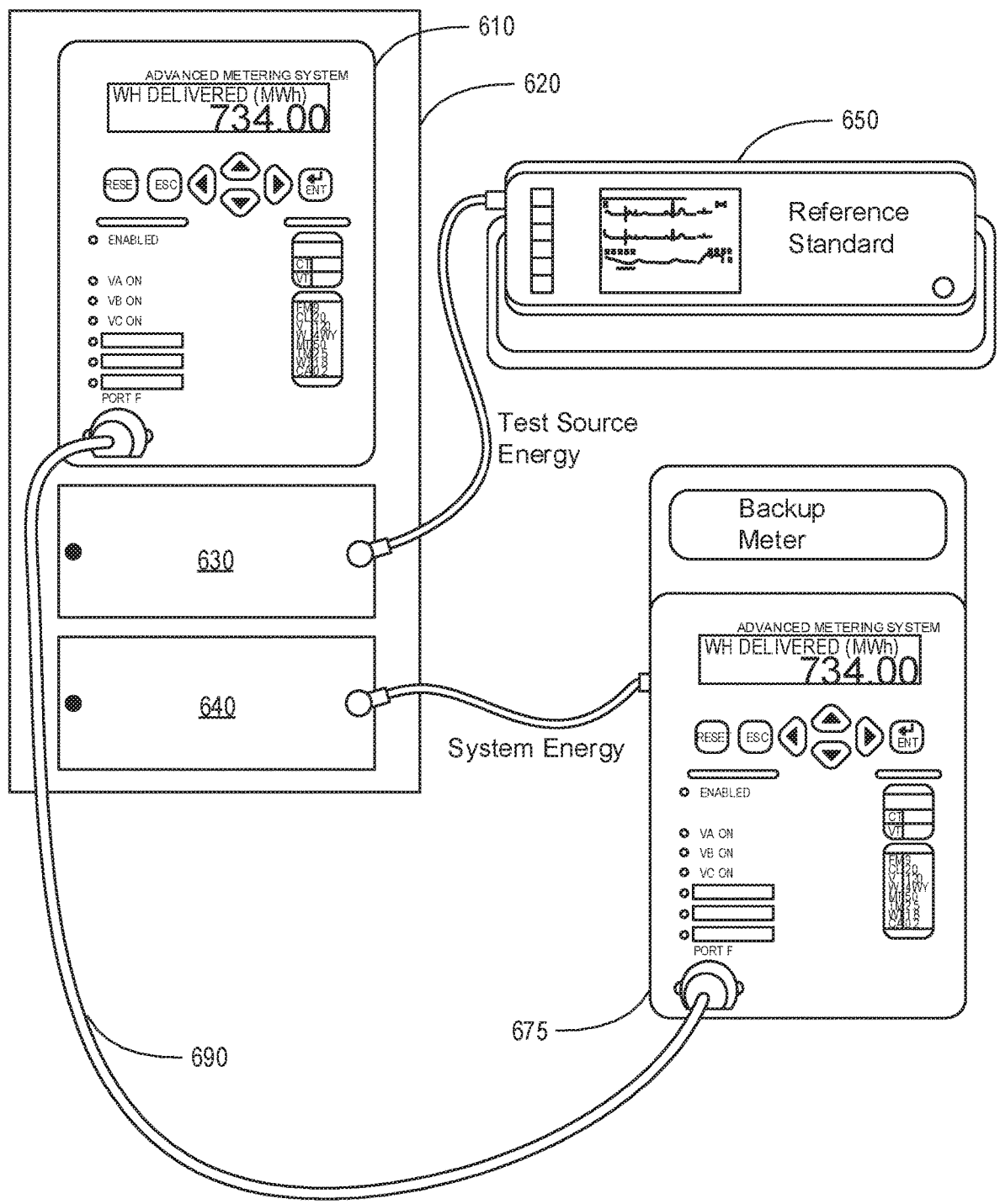
FIG. 6 illustrates a real-time transfer of system energy data from the backup meter to the primary meter, according to one embodiment.

FIG. 6 illustrates a primary meter 610 mounted to a panel 620 that includes a test access port 630 and a system access port 640. The primary meter 610 may monitor an electric power system and collect and transmit power quality and/or consumption data to other systems within the electric power system. As illustrated, a reference standard test signal injection device 650 may inject a test signal via the test access port 630 into the primary meter 610. The test signal injection device 650 may inject a known signal into the primary meter 610. Again, if the data collected by the primary meter 610 matches the known signal, or is at least within a predetermined tolerance, the primary meter 610 may be validated or otherwise confirmed function. Otherwise, the primary meter 610 may fail testing.

While the primary meter 610 is being tested, a secondary or backup meter 675 may be connected to the electric power system via the system access port 640. While the primary meter 610 is being tested, the secondary meter 675 may collect the power quality and/or consumption data. The secondary meter 675 may be connected to the primary meter 610 for real-time data transfer via a cable 690. The secondary meter 675 may alternatively be wireless connected to the primary meter 610.

The primary meter 610 may be placed in a testing mode during testing. As previously described, in a testing mode the primary meter 610 may store and/or transmit data collected by the secondary meter 675 as the system data and distinguish it from the data collected based on the test signal injected by the test signal injection device 650. The secondary meter 675 may be time synchronized with the primary meter 610 to ensure that data collected during testing is time-aligned with data previously and subsequently collected by the primary meter 610.

Figure 7:
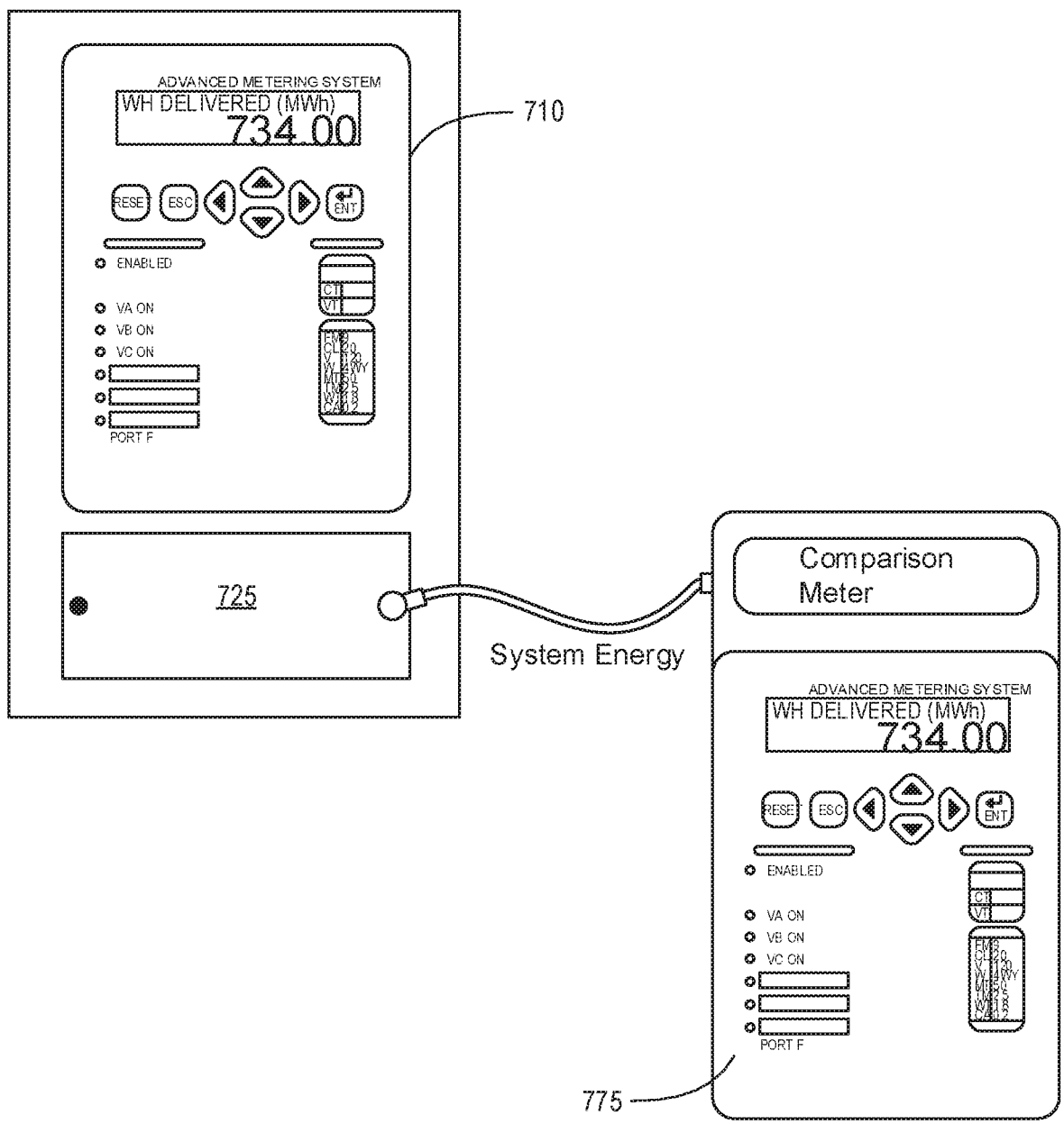
FIG. 7 illustrates parallel monitoring of system energy data by a primary meter and a reference backup meter for functional validation of the primary meter, according to one embodiment.

FIG. 7 illustrates parallel monitoring of system energy data by a primary meter 710 and a reference backup meter 775 for functional validation of the primary meter 710, according to one embodiment. In such an embodiment, the primary meter 710 may monitor an electric power system. A reference backup meter 775, permanently installed or temporarily connected, may be used to confirm the validity of the data collected by the primary meter 710.

Figure 8A:
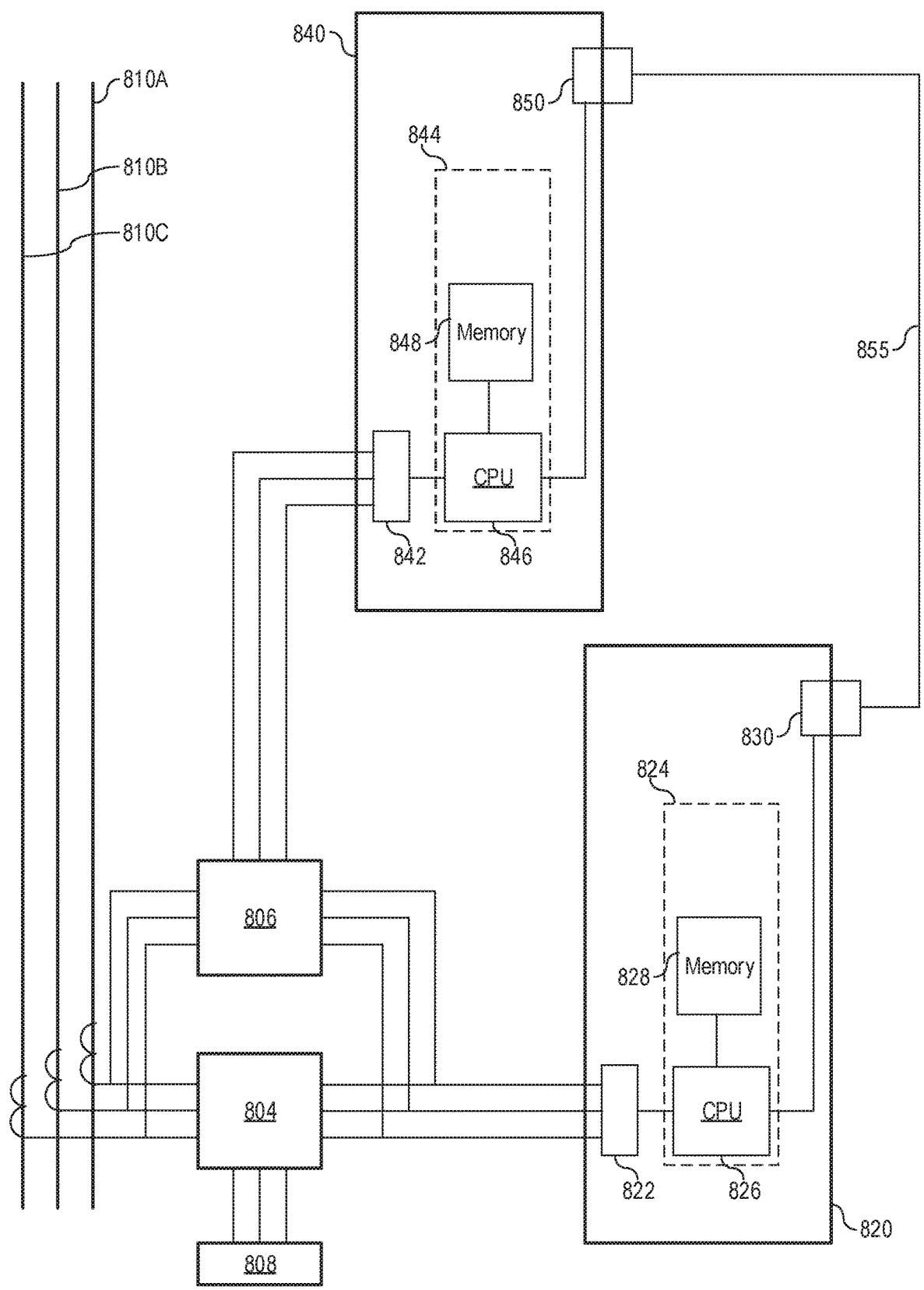
FIG. 8A illustrates a simplified block diagram of a system for testing a primary electric power meter, according to one embodiment.

FIG. 8A illustrates a simplified line diagram of a system that may be used to test a primary electric power system meter without loss of monitoring during the test operations. The monitored electric power system may include a three-phase power system with three conductors 810A, 8106, 810C for carrying electric power between a source and a load. Electric power may be monitored using a primary meter 820 in electrical communication with the conductors 810A, 810B, 810C. As illustrated, current transformers (CTs) are used to obtain signals relative to electrical currents on the conductors for the primary meter 820. Although not separately illustrated, the primary meter 820 may also obtain other signals relating to the electric power system such as, for example, signals relative to the voltage on the conductors using potential transformers (PTs).

Current and/or voltage signals from the electric power system may be transmitted to the primary meter 820 using a test switch 804. In normal operation, the test switch 804 is configured to transmit the signals from the electric power system to the primary meter 820. The test switch 804 may be configured to selectively disconnect the primary meter 820 from the electric power system and instead supply test signals from a testing device 808 to the primary meter 820 during testing of the primary meter 820. Thus, during testing the primary meter 820 receives test signals from the testing device 808 instead of electric power system signals. The primary meter 820 is tested by applying its monitoring functions to the test signals provided by the testing device 808. However, during this testing, the electric power system signals are not available to the primary electric meter 820.

Accordingly, a second test switch 806 may be in electrical communication with the electric power system, and configured to apply electric power system signals to devices connected thereto. A secondary meter 840 may be selectively connected to the second test switch 806 to obtain electric power system signals and apply monitoring functions thereto when the secondary meter 840 is in electrical communication with the second test switch 806.

During testing of the primary electric power system meter 820, the system is configured such that the secondary meter 840 obtains electric power system signals, monitors the electric power system, and supplies the results of the monitoring functions to the primary meter 820 via a wired or wireless connection 855, such that the primary meter 820 may have minimal or no data loss even during testing thereof.

In one embodiment, the secondary meter 840 may be a removable or portable test meter that may obtain electric power system signals via the second test switch 806. The primary meter 820 may be a permanent meter that has been installed in a panel and wired to receive electric power system signals from the electric power system via the first test switch 804 that is also installed in a panel. The first test switch 804 may be configured to be selectively connected to a test set 808 using, for example, a test plug or access port. The first test switch 808 may be configured to remove connection of the electric power system signals to the primary meter 820 and supply signals provided by the test set 808 to the primary meter 820. The test set 808 may be a portable test set configured to supply predetermined test signals for testing of electric power system meters.

The panel may include a second test switch 806 in electrical communication with the electric power delivery system and configured to supply electric power system signals to a power meter that may be connected thereto. The secondary power meter 840 may be selectively connectable to the second test switch 806 using, for example, a test plug.

The secondary meter 840 may be in communication with the primary meter 820. In one embodiment, one or both of the primary meter 820 and the secondary meter 840 may include a communication port to facilitate communication between the primary and secondary meters. The primary meter 820 may include a communication port 830 on the face thereof such as an ANSI Type II optical port. Similarly, the secondary meter 840 may also include a communication port 850 such as an ANSI Type II optical port. In embodiments where the secondary meter 840 is removable or portable, the communication port 850 may be on any face thereof. Although the illustrated port may be an ANSI Type II optical port, the primary and secondary meters 820, 840 may include any type of communication port capable of allowing communication between the meters in accordance with embodiments herein, such as, for example, EIA-232 ports, Ethernet ports, wireless communications (e.g. in accordance with the Bluetooth® standard), and the like.

Primary and secondary meters 820, 840 may communicate using, for example, communication ports 830, 850. The primary meter 820 may enter a test mode wherein the primary meter 820 and secondary meter 840 are time aligned. When communication between the primary meter 820 and the secondary meter 840 is initiated, the primary meter 820 and secondary meter 840 may align their clocks. In one embodiment, the secondary meter 840 may align its time with the primary meter 840.

The upon the primary meter 840 entering its testing mode, the secondary meter 820 may perform monitoring functions using the electrical power system signals supplied thereto by the second test switch 806. The monitoring functions of the secondary meter 820 may be similar or identical to the monitoring functions of the primary meter 840. Using the communication channel between the primary meter 820 and the secondary meter 840, the secondary meter 820 may transmit the results of its monitoring functions to the primary meter 840, and the primary meter 840 may record such results during the time that the primary meter 840 does not perform monitoring functions on signals from the electric power system due to the supply of testing signals thereto. Thus, the primary meter 820 may record results of monitoring functions of the electric power system signals even during testing thereof.

In certain embodiments, the primary electric power system meter 820 may include an input module 822 for digitizing the analog signals provided thereto by the electric power system or the test set 808. The input module 822 may include, for example, an A/D converter, multiplexer, filters, and the like. The digitized analog signals may be made available to a monitoring module 824 for monitoring and recording. The monitoring module 824 may include a processor 826 and a memory 828. The memory 828 may include various metering modules that when executed on the processor perform monitoring functions such as energy, demand, power, voltage, current, frequency, load, waveform, flicker, VSSI, sequence of events, harmonics, and other calculations. The results of such monitoring functions may be stored in the memory.

The memory of the primary meter 820 may also include a testing module that when initiated and executed by the processor 826 may cause the primary meter 820 to enter a testing mode, wherein the results of the testing functions are not recorded with the stored results of the monitoring functions. The testing module may be initiated by user command on a front panel of the primary meter 820 or other user interfaces to the primary meter 820. The testing module may also cause the meter to time-align with the secondary meter 840. The testing module may further cause the primary meter 820 to record results of monitoring functions received from the secondary meter 840 in the memory 828 during testing state.

In certain embodiments, the secondary meter 840 may include an input module 842 for digitizing the analog signals provided thereto by the electric power system. The input module 842 may include, for example, an A/D converter, multiplexer, filters, and the like. The digitized analog signals may be made available to a monitoring module 844 for monitoring and recording. The monitoring module 844 may include a processor 846 and a memory 848. The memory 848 may include various metering modules that when executed on the processor perform monitoring functions such as energy, demand, power, voltage, current, frequency, load, waveform, flicker, VSSI, sequence of events, harmonics, and other calculations. The results of such monitoring functions may be stored in the memory.

The memory 848 may further include a testing module that, when initiated and executed on the processor 846 cause the secondary meter to align its time with the primary meter 820, and to communicate results of the monitoring functions to the primary meter 840.

In one embodiment, the primary meter 820 may be configured to obtain results of the monitoring functions of the secondary meter 840 following testing of the primary meter 820, wherein the results may be written into memory of the primary meter 820 immediately in real-time or after testing thereof.

In one embodiment, the secondary meter 840 may be used to compare results of monitoring functions of the secondary meter 840 and the primary meter 820. In this embodiment, both the primary meter 820 and the secondary meter 840 may receive electric power system signals via the test switches 804, 806. The primary and secondary meters 820, 840 may be configured to align time, and perform metering functions on the same electric power system signals. Each of the primary and secondary meters 820, 840 may record results of the metering functions for comparison.

Figure 8B:
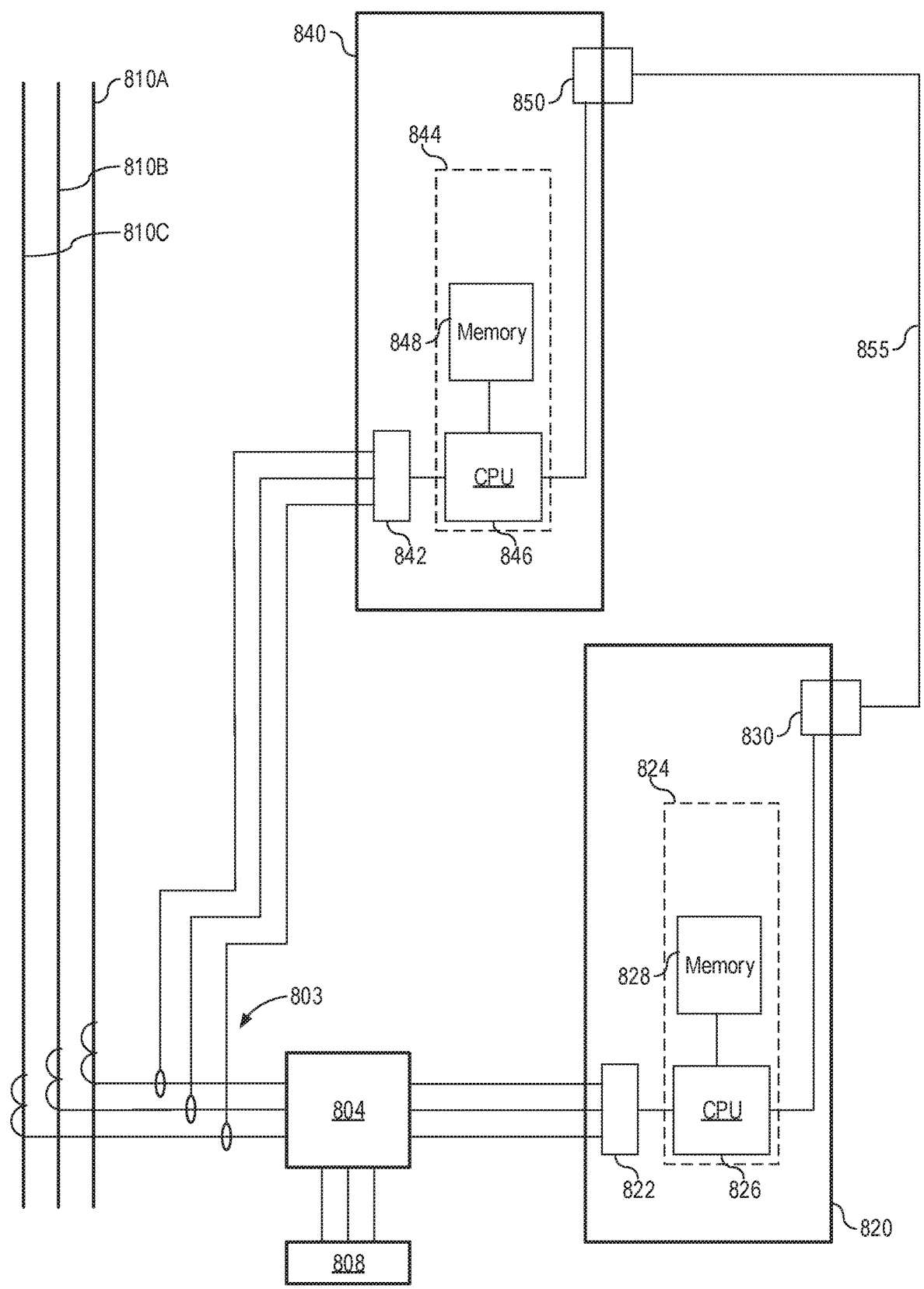
FIG. 8B illustrates an alternative simplified block diagram of a system for testing a primary electric power meter, according to one embodiment.

FIG. 8B illustrates a simplified line diagram of another embodiment of a system that may be used to test a primary electric power system meter without loss of monitoring during the test operations. As before, the monitored electric power system may include a three-phase power system with three conductors 810A, 810B, 810C for carrying electric power between a source and a load. Electric power may be monitored using a primary meter 820 in electrical communication with the conductors 810A, 810B, 810C. As illustrated, current transformers (CTs) are used to obtain signals relative to electrical currents on the conductors for the primary meter 820

As in FIG. 8A, current and/or voltage signals from the electric power system may be transmitted to the primary meter 820 using a test switch 804. In normal operation, the test switch 804 is configured to transmit the signals from the electric power system to the primary meter 820. The test switch 804 may be configured to selectively disconnect the primary meter 820 from the electric power system and instead supply test signals from a testing device 808 to the primary meter 820 during testing of the primary meter 820.

Thus, during testing the primary meter 820 receives test signals from the testing device 808 instead of electric power system signals. The primary meter 820 is tested by applying its monitoring functions to the test signals provided by the testing device 808. However, during this testing, the electric power system signals are not available to the primary electric meter 820.

A secondary meter 840 may be selectively connected to electric power system via transformers, transducers, a switch, or the like. For example, split core transducers, solid core transducers, or Rogowski coils 803 may be used to obtain electric power system signals and apply monitoring functions thereto. In the illustrated example, the secondary meter 840 may be portable and easily disconnected from the system by de-coupling the Rogowski coils 803 from the lines carrying the electric power system signals from the CTs.

As before, the primary and secondary meters 820, 840 may communicate using, for example, communication ports 830, 850. The primary meter 820 may enter a test mode wherein the primary meter 820 and secondary meter 840 are time aligned. When communication between the primary meter 820 and the secondary meter 840 is initiated, the primary meter 820 and secondary meter 840 may align their clocks. In one embodiment, the secondary meter 840 may align its time with the primary meter 840.

The upon the primary meter 840 entering its testing mode, the secondary meter 820 may perform monitoring functions using the electrical power system signals supplied thereto by the Rogowski coils 803. The monitoring functions of the secondary meter 820 may be similar or identical to the monitoring functions of the primary meter 840. Using the communication channel between the primary meter 820 and the secondary meter 840, the secondary meter 820 may transmit the results of its monitoring functions to the primary meter 840, and the primary meter 840 may record such results during the time that the primary meter 840 does not perform monitoring functions on signals from the electric power system due to the supply of testing signals thereto. Thus, the primary meter 820 may record results of monitoring functions of the electric power system signals even during testing thereof.

Figure 9:
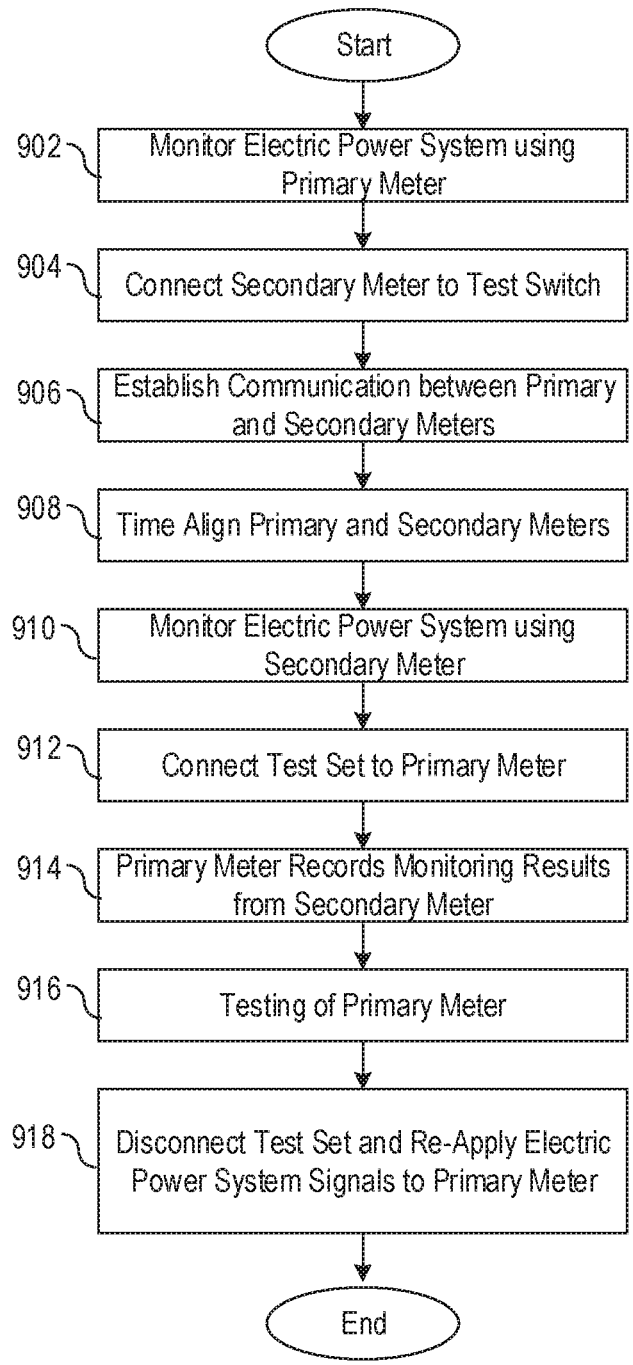
FIG. 9 illustrates a method of testing a primary electric power system meter without loss of monitoring data, according to one embodiment.

FIG. 9 illustrates a method of testing a primary electric power system meter without loss of monitoring data. Many steps of the method may be performed in different orders and/or concurrent with one another. A primary meter may monitor, 902, an electric power system. A secondary meter may be connected, 904, to a test switch such that the electric power system signals are supplied to the secondary meter. Communication may be established, 906, between the primary and secondary meters. The primary and secondary meters may be time-aligned, 908. In some embodiments, a test initiating signal may be send to the primary meter to allow it to stop monitoring the electric power system, pass through data from the secondary meter, and/or expect to receive monitored data from the secondary meter after testing is completed.

In various embodiments, the primary meter and/or secondary meter may have specific permission settings that require authentication (e.g., passwords, usernames, etc.). Moreover, the primary meter may be subject to various regulatory rules regarding testing and functionality, especially in the case where the meter are used for revenue determination. Thus, the primary meter and/or the secondary meter may be comply with various regulations, read and write permissions, and/or incorporate encryption and/or anti-tampering mechanisms to ensure regulatory compliance.

The secondary meter may be used to monitor, 910, the electric power system. A test set may be connected, 912, to the primary meter such that the test signals may be applied to the primary meter. The primary meter may record, 914, the monitoring results from the secondary meter. The primary meter may be tested, 916, based on its performance of monitoring functions using signals from the test set. Upon conclusion of the testing, the test set may be disconnected, 918, and the electric power system signals may be re-applied to the primary meter. The primary meter may continue to perform monitoring functions using the electric power system signals and recording results thereof in its memory, including those obtained by the secondary meter while the primary meter was being tested.

Figure 10:
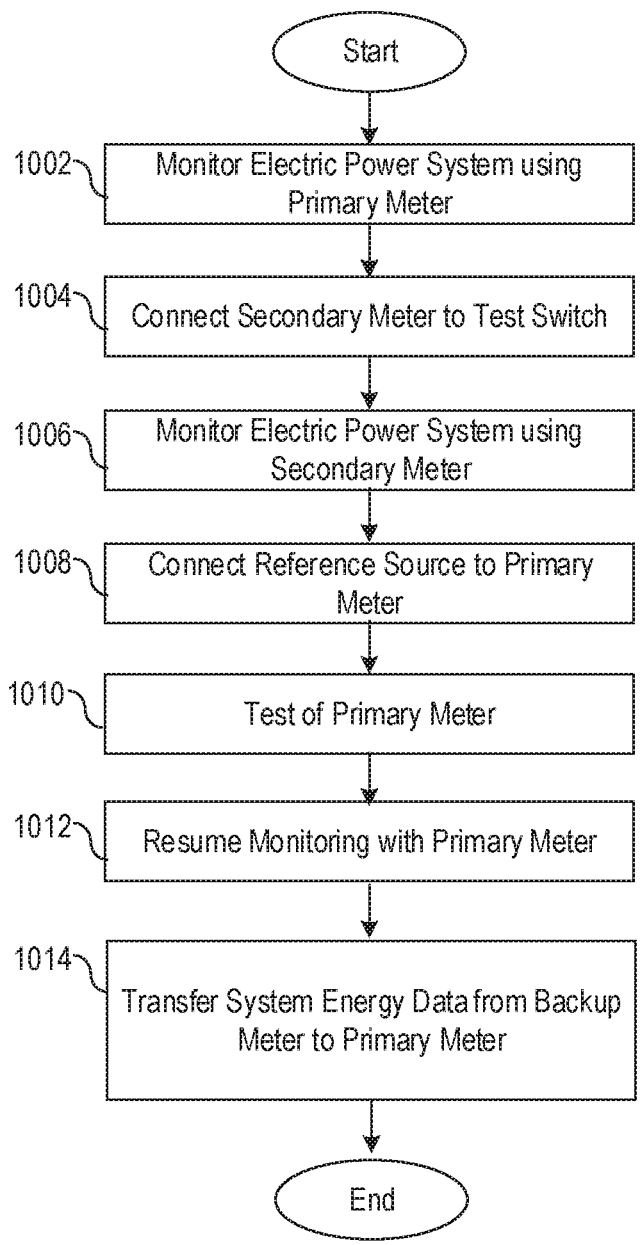
FIG. 10 illustrates another method of testing a primary electric power system meter without loss of monitoring data, according to one embodiment.

FIG. 10 illustrates another method of testing a primary electric power system meter without loss of monitoring data, according to one embodiment. A primary meter may be used to monitor, 1002, an electric power system. A secondary meter may be connected, 1004, via a test switch. The test switch may be used to switch signals from the electric power system between the primary meter to the secondary meter. The secondary meter may be used to monitor, 1006, the electric power system to allow the primary meter to be tested while the electrical power system continues to be monitored.

A reference source may be connected, 1008, to the primary meter and the primary meter may be tested, at 1010. Once testing is complete, the switch may be used to redirect the signals from the electric power system back to the primary meter. The primary meter may resume, 1012, monitoring the electric power system. Data collected by the secondary meter while the primary meter was being tested may be transferred to the primary meter and/or other system data collection device.

In some embodiments, the primary meter and the secondary meter may be time aligned and/or utilize a common time signal. In other embodiments, the two meters may measure the same information for a short period of time prior to testing. That common data may be used to time-align the subsequently collected data during testing or post-testing.

Figure 11:
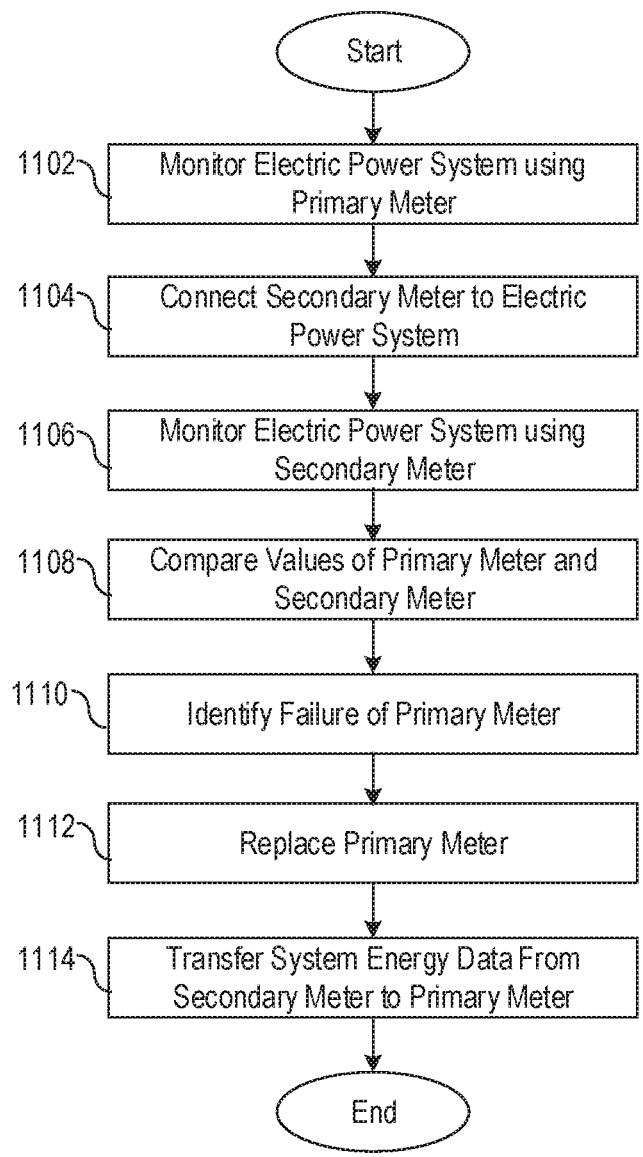
FIG. 11 illustrates another method of testing a primary electric power system meter without loss of monitoring data, according to one embodiment.

FIG. 11 illustrates another method of testing a primary electric power system meter without loss of monitoring data, according to one embodiment. In the illustrated method, a primary meter is used to monitor, 1102, an electric power system. A secondary meter is connected, 1104, to the electric power system for concurrent monitoring, at 1106. The collected data from the primary meter is compared, 1108, with the data collected by the secondary meter. Data from the secondary meter is treated as reference data and if data from the primary meter deviates beyond a predefined threshold, the primary meter is identified, 1110, as having failed. The primary meter may be replaced, 1112. During the replacement of the primary meter, the secondary meter continues to monitor the system and collect data. Once the primary meter is replaced, data collected by the secondary meter may be transferred, 1114, to the secondary meter such that monitored data is recorded throughout the replacement process.

The examples and illustrations provided relate to specific embodiments and implementations of a few of the many possible variations. It is understood that the disclosure is not limited to the precise configurations and components disclosed herein. Accordingly, many changes may be made to the details of the above-described embodiments without departing from the underlying principles of this disclosure. The scope of the present invention should, therefore, be determined in the context of the possible claims that are supportable by this disclosure, including the following.

What is claimed:

1. A system for testing a primary meter, comprising:
   a first test switch in electrical communication with an electric power system to selectively switch electrical signals from the electric power system to a primary meter connection during non-test operations, and test signals from test signal connections to the primary meter connection during test operations;
   a primary meter connected to the primary meter connection to capture energy data of the electric power system during non-test operations and configured to be disconnected from the electric power system during test operations; and
   a secondary meter configured to be connected to the electrical signals from the electric power system during test operations to capture energy data of the electric power system during test operations,
   wherein the secondary meter is configured to communicate the energy data captured by the secondary meter of the electric power system to the primary meter during test operations.

2. The system of claim 1, further comprising:
   a test signal injector configured to inject a known test signal to the primary meter via the test signal connections of the first test switch during test operations; and
   a validation module configured to evaluate energy data captured by the primary meter of the known test signal during test operations to determine a functional status of the primary meter.

3. The system of claim 1, further comprising:
a time-alignment module configured to time-align the secondary meter with the primary meter prior to beginning test operations.

4. The system of claim 1, wherein each of the primary meter and the secondary meter receive a common time signal for time-alignment of captured energy data.

5. The system of claim 1, wherein each of the primary meter and the secondary meter comprise a data port to allow the secondary meter to communicate captured energy data of the electric power system to the primary meter in real time during test operations.

6. The system of claim 1, wherein secondary meter comprises a portable electric power system meter that is temporarily connected to the secondary meter connection for test operations and subsequently disconnected.

7. The system of claim 6, wherein secondary meter is configured to be temporarily connected to the electrical signals from the electric power system via at least one of a solid core transducer, a split core transducer, and a Rogowski coil.

8. The system of claim 6, wherein the first test switch is further configured to switch the electrical signals from the electric power system to a secondary meter connection during test operations, wherein the secondary meter is configured to be connected to the secondary meter connection.

9. The system of claim 1, wherein secondary meter comprises a permanently installed electric power system meter connected to the secondary meter connection of the first test switch.

10. The system of claim 1, wherein secondary meter is configured to communicate captured energy data of the electric power system to the primary meter during test operations by storing the captured energy data in a data store accessible to the primary meter.

11. The system of claim 1, wherein the primary meter and secondary meter are each configured to capture energy data of the electric power system that includes consumption data and power quality data.

12. The system of claim 1, wherein the primary meter is configured to capture energy data of the electric power system that includes consumption data and power quality data, and wherein the secondary meter is configured to capture energy data of the electric power system that includes only one of consumption data and power quality data.

13. A method for testing a primary electric power meter, comprising:
monitoring an electric power system using a primary electric power meter device during a first time period;
storing energy data captured by the primary electric power meter during the first, pre-testing time period in a data store;
connecting a secondary electric power meter to the electric power system;
operably disconnecting the primary electric power meter from the electric power system during a second, testing time period for testing of the primary electric power meter;
monitoring the electric power system using the secondary electric power meter device during the second, testing time period;
storing energy data captured by the secondary electric power meter during the second, testing time period in the data store;
operably reconnecting the primary electric power meter to the electric power system during a third, post-testing time period;
monitoring the electric power system using the operably reconnected primary electric power meter during the third, post-testing time period; and
storing energy data captured by the primary electric power meter during the third, post-testing time period in the data store,
such that the data store includes captured energy data during each of the time periods, including the second, testing time period when the primary electric power meter was operably disconnected from the electric power system.

14. The method of claim 13, further comprising:
time-aligning the second electric power meter with the primary electric power meter, such that energy data captured and stored by the secondary electric power meter during the second, testing time period is time-aligned with respect to the energy data captured and stored by the primary electric power meter during the first, pre-testing time period and the third, post-testing time period.

15. The method of claim 13, wherein operably disconnecting the primary electric power meter from the electric power system during the second, testing time period comprises electrically disconnecting the primary electric power meter from the electric power system via at least one switch.

16. The method of claim 13, further comprising:
injecting known test signals into the primary electric power meter during the second, testing time period;
capturing energy data of the injected known test signals via the primary electric power meter during the second, testing time period; and
comparing the captured energy data with the known test signals to determine if the captured energy data is within a tolerance threshold of accuracy.

17. The method of claim 13, wherein the data store is within the primary electric power meter.

18. The method of claim 17, wherein the secondary electric power meter is communicatively coupled to the primary electric power meter to transfer the energy data captured by the secondary electric power meter during the second, testing time period to the primary electric power meter for storing the energy data within the data store within the primary electric power meter.

19. The method of claim 18, further comprising:
transferring the energy data captured by the secondary electric power meter during the second, testing time period to the primary electric power meter for storage within the data store in real time.

20. The method of claim 18, further comprising:
transferring the energy data captured by the secondary electric power meter during the second, testing time period to the primary electric power meter for storage during the third, post-testing period.

21. The method of claim 13, wherein the primary electric power meter is configured to monitor power consumption associated with the electric power system for revenue calculations.

22. The method of claim 13, wherein the primary electric power meter is configured to monitor power quality metrics of the electric power system.

23. A system for testing a primary monitoring device, comprising:
a first test switch in electrical communication with an electric power system to selectively switch electrical signals from the electric power system to a primary device connection during non-test operations, and test signals from test signal connections to the primary device connection during test operations;

a primary monitoring device connected to the primary device connection to capture energy data of the electric power system during non-test operations and configured to be disconnected from the electric power system during test operations; and a secondary monitoring device configured to be connected to the electrical signals from the electric power system during test operations to capture energy data of the electric power system during test operations, wherein the secondary monitoring device is configured to communicate the energy data captured by the secondary meter of the electric power system to the primary monitoring device during test operations.

* * * * *